United States Patent
Gilbert

(10) Patent No.: US 7,514,706 B2
(45) Date of Patent: Apr. 7, 2009

(54) VOLTAGE REFERENCE CIRCUIT USING PROGRAMMABLE METALLIZATION CELLS

(75) Inventor: Nad Edward Gilbert, Higley, AZ (US)

(73) Assignee: Adesto Technologies, Sunnyvale, CA (US)

( * ) Notice: Subject to any disclaimer, the term of this patent is extended or adjusted under 35 U.S.C. 154(b) by 234 days.

(21) Appl. No.: 11/549,964

(22) Filed: Oct. 16, 2006

(65) Prior Publication Data
US 2007/0115749 A1    May 24, 2007

Related U.S. Application Data

(60) Provisional application No. 60/726,905, filed on Oct. 14, 2005.

(51) Int. Cl.
*G11C 11/00* (2006.01)

(52) U.S. Cl. ............................. 257/3; 365/148; 365/158
(58) Field of Classification Search ..................... 257/3; 365/148, 158
See application file for complete search history.

(56) References Cited

U.S. PATENT DOCUMENTS

| | | | |
|---|---|---|---|
| 2003/0222280 A1* | 12/2003 | Moore | 257/200 |
| 2004/0264244 A1* | 12/2004 | Morimoto | 365/180 |

* cited by examiner

*Primary Examiner*—Thomas L Dickey
(74) *Attorney, Agent, or Firm*—Snell & Wilmer L.L.P.

(57) ABSTRACT

A programmable metallization cell voltage reference is disclosed. The voltage reference can be taken from the anode to ground, from the cathode to ground, or differentially across the programmable metallization cell device.

11 Claims, 4 Drawing Sheets

VOLTAGE REFERENCE CIRCUIT USING PROGRAMMABLE METALLIZATION CELLS

INTRODUCTION

By using the threshold voltage for resistance change of the Programmable Metallization Cell (PMC) and the relationship of the programmed device resistance equal to the threshold voltage of the device divided by the programming current, a voltage reference can be generated that is related to the threshold voltage of the PMC device. The general description of this circuit and an example implementation are present in this document. Alternate circuit variations are also depicted.

SUMMARY OF THE INVENTION

When a PMC device is programmed with a set current, the voltage across the device is limited to the threshold voltage for resistance change of the PMC element. This threshold voltage is defined as the voltage at which a large resistance change is initiated in the PMC device and ranges from 100 mV to 350 mV typically. It is usually very consistent for a given set of devices. If this potential is maintained across the device, the resistance will continue to drop until the voltage across the device is limited to the minimum potential for electrodeposition. Below this minimum voltage, the device operation is essentially ohmic. This minimum potential is usually equal to one half the threshold voltage of the device. By using a constant programming current to drop the resistance of the PMC device so that the voltage across the device is equal to the threshold voltage and then quickly dropping that current to one half the programming current, which is maintained, the voltage across the PMC element is held at one half the threshold voltage since the device is acting as a resistor in that voltage regime.

BRIEF DESCRIPTION OF THE DRAWING FIGURES

DETAILED DESCRIPTION

Figure 2:
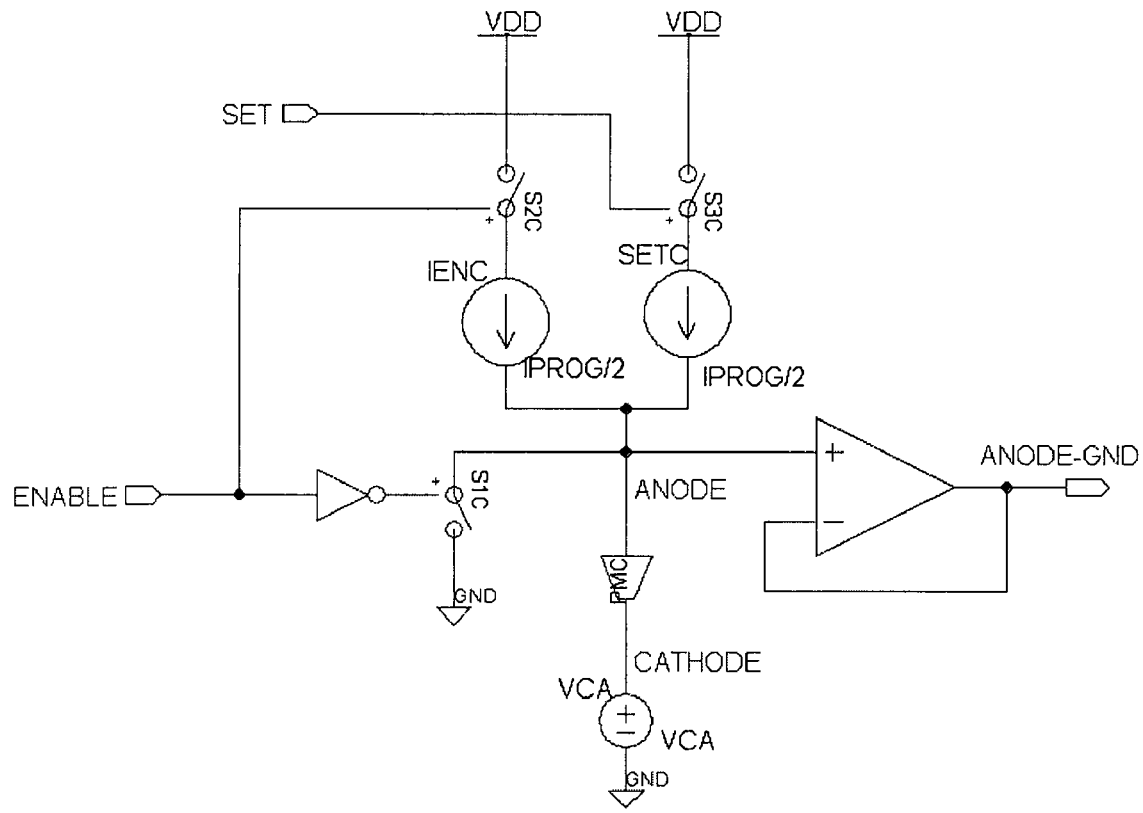
FIG. 2 illustrates a PMC Voltage Reference with a common cathode voltage to other PMC devices in the system and the output voltage being the anode voltage referenced to ground. Here the op amp depicts a unity gain voltage buffer.
Figure 3:
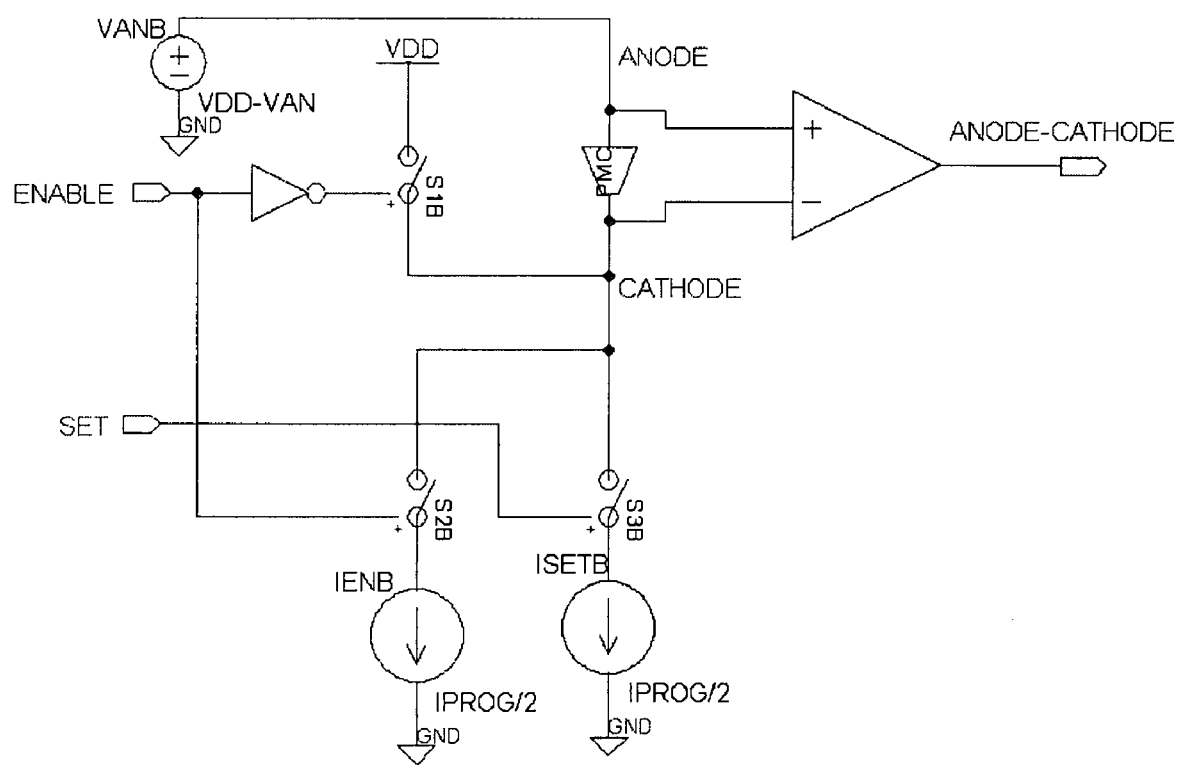
FIG. 3 illustrates a PMC Voltage Reference with a common anode voltage to other PMC devices in the system and the output voltage being the voltage across the device, Anode-Cathode. Here the op amp depicts voltage subtraction with unity gain.
Figure 4:
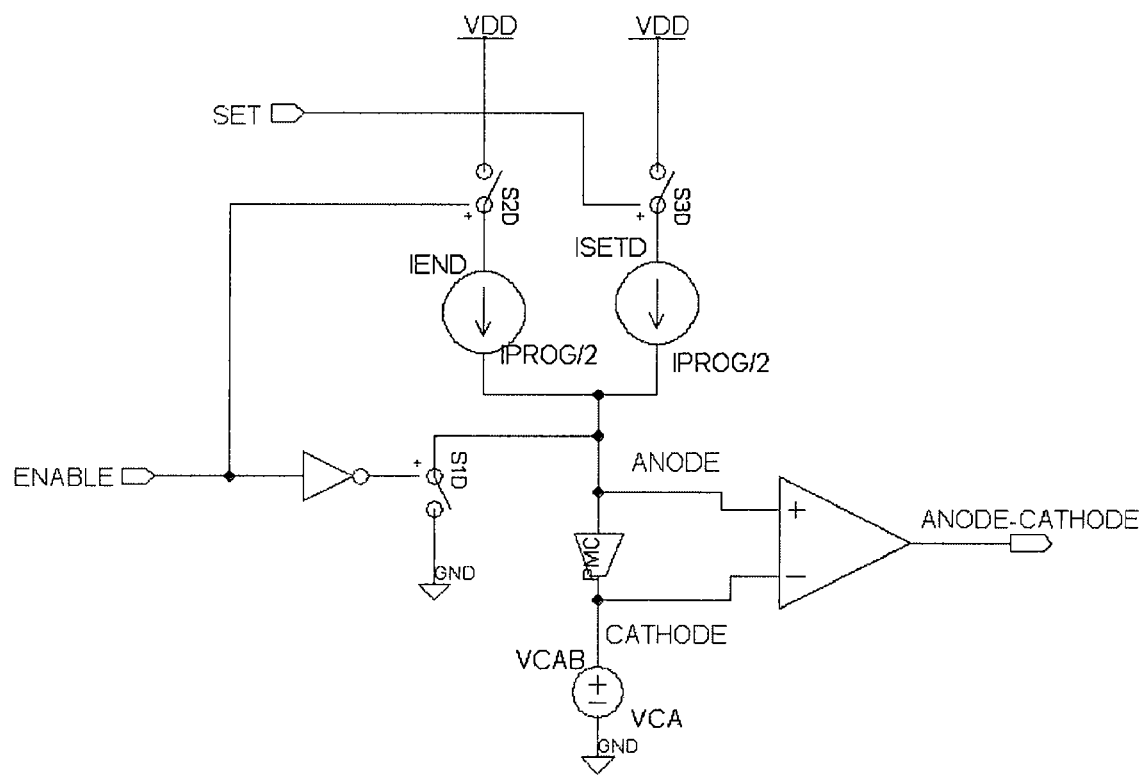
FIG. 4 illustrates a PMC Voltage Reference with a common cathode voltage to other PMC devices in the system and the output voltage being the voltage across the device, Anode-Cathode. Here the op amp depicts voltage subtraction with unity gain.

The implementation of the exemplary PMC voltage reference is one example of using PMC as a voltage reference and does not limit the application of the design concept in other circuit configurations. For example, the voltage reference can be taken from the anode to ground, as described below in connection with FIG. 1, from the cathode to ground, FIG. 2, or differentially across the PMC device in either case, see FIGS. 3 and 4.

Figure 1:
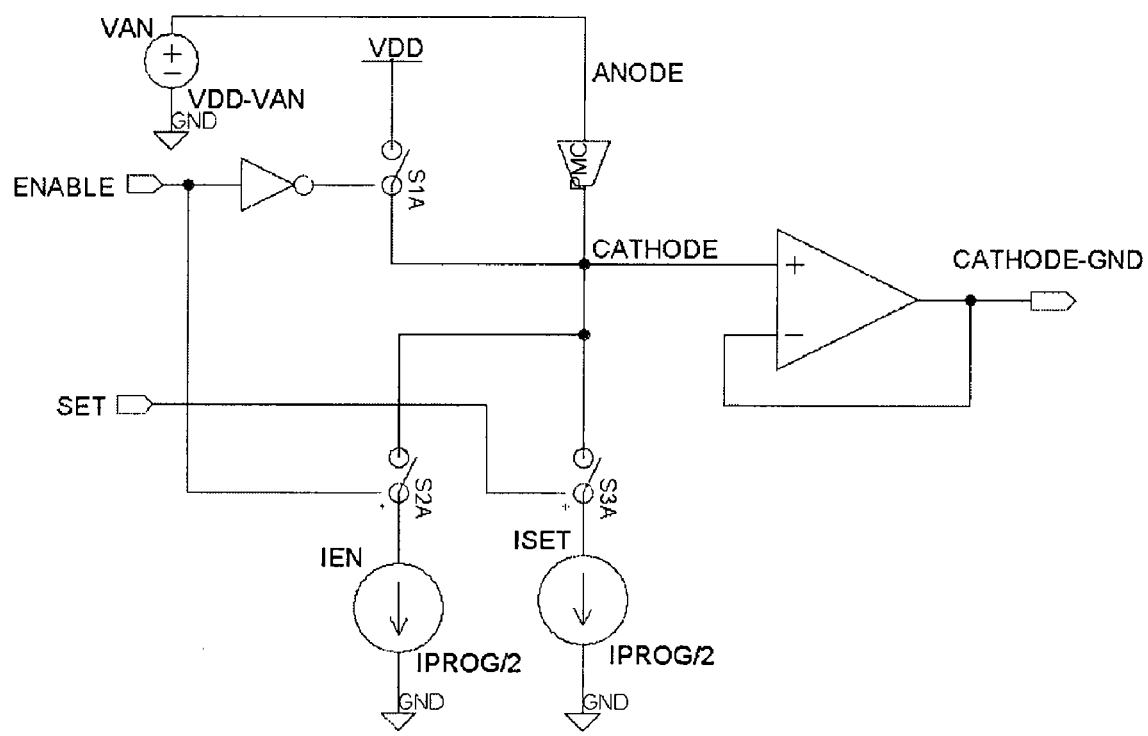
FIG. 1 illustrates a PMC Voltage Reference with a common anode voltage to other PMC devices in the system and the output voltage being the cathode voltage referenced to ground. Here the op amp depicts a unity gain voltage buffer.

The PMC device is labeled "PMC" in FIG. 1 and is used in a common anode configuration, or the anode voltage is common to other PMC devices in the system. The switches S1A to S3A in FIG. 1 represent solid state switches and could be implemented with transistors. The current source, inverter and unity gain buffer could also be implemented with common transistor level design to implement the depicted functions. In this particular implementation, the PMC bias circuit can be enabled as shown in the schematic in FIG. 1. The programming current can be any appropriate value for the system in which the bias circuit is being used. Typical values would be from 10 uA to 1 mA. The key is that one half the programming current is constant while the circuit is enabled. When the circuit is disabled, the enable signal is low and switch 1 pulls the cathode voltage to the supply voltage forcing a reverse bias across the device forcing it to an erased state, or high resistance. The supply voltage must be larger than the anode voltage by the appropriate erase voltage for the PMC device, which would range from 100 mV to 2 V. Some possible voltages for the supply voltage could be from 1 V to 5 V. The output voltage buffer can be disabled or enabled outputting a high-Z or the supply voltage respectively. In FIG. 1, the output buffer is enabled. The anode voltage is usually common to other PMC device in the system and is a low impedance voltage source. The value of the anode voltage is not important, it only need be constant, less than the supply voltage and greater than the negative supply voltage or ground, as depicted in FIG. 1. The current sources would be disabled as well. When the device is enabled, one half the programming current is forced through the device depicted by the current source IEN. At the same time, the SET signal enables current source IEN for a short period of time so that the resistance of the device drops limiting the voltage across the PMC device to the threshold voltage by forcing the full programming current from anode to cathode. The SET signal is then toggled low and the voltage across the device falls to one half the threshold voltage of the PMC device because the IEN current source forces only one half the full programming current and the device is operating as a resistor. The voltage at the cathode is then buffered to supply a low impedance voltage source.

I claim:

1. A method of operating a programmable variable resistance cell voltage reference, said method comprising:

forcing a programming current into a programmable variable resistance cell for a predetermined period of time, wherein the programming current instigates a change of resistance in the programmable variable resistance cell;

causing the programming current in the programmable variable resistance cell to produce a reduced current and to stop programming after said predetermined programming period; and buffering the resulting voltage across the programmable variable resistance cell with a voltage amplifier, wherein the resulting voltage across the programmable variable resistance cell is the difference between the potentials of the first terminal and the second terminal of said programmable variable resistance cell.

2. The method as recited in claim 1, wherein said programmable variable resistance cell includes a first terminal and a second terminal, wherein one of said first and second terminals of said programmable variable resistance cell is common to other programmable variable resistance cells in a system and is held at a predetermined low impedance voltage potential.

3. The method as recited in claim 1, further comprising:
disabling said reduced current in said programmable variable resistance cell; and
forcing a reverse bias across the programmable variable resistance cell to disable said programmable variable resistance cell voltage reference and increase the resistance of said programmable variable resistance cell.

4. The method as recited in claim 1, further comprising referencing an output from the step of buffering the resulting voltage across the programmable variable resistance cell from one terminal of the programmable variable resistance cell to the lowest potential of the system.

5. The method as recited in claim 1, wherein the programmable variable resistance cell limits a voltage across the first terminal and the second terminal to a threshold voltage for programming said programmable variable resistance cell when said programming current is forced into said programmable variable resistance cell.

6. The method as recited in claim 1, wherein a ratio of said programming current and said reduced current is proportional to a ratio of a threshold voltage for programming and a resulting bias across the programmable variable resistance cell.

7. A voltage reference, comprising:
a programmable variable resistance cell, having an anode and a cathode, wherein a reduction in resistance in said programmable variable resistance cell occurs when a voltage threshold for programming is developed across the anode and the cathode, and an increase in resistance occurs when voltage threshold for erase is developed from the cathode to the anode;
a first low impedance voltage source coupled to the anode;
a second low impedance voltage source, of lower value than the first low impedance voltage source, coupled to the cathode via a first switch;
a first current source coupled to the cathode via a second switch;
a second current source coupled to the cathode via a third switch; and
an amplifier coupled to the cathode to perform voltage buffering,
wherein the amplifier is coupled to said anode and said cathode to output a difference in potentials across said programmable variable resistance cell.

8. The voltage reference as recited in claim 7, wherein said first and second current sources are implemented with transistors.

9. A voltage reference, comprising:
a programmable variable resistance cell having an anode and a cathode, wherein a reduction in resistance in said programmable variable resistance cell occurs when a voltage threshold for programming is developed across the device from the anode to the cathode, and an increase in resistance occurs when a voltage threshold for erase is developed from the cathode to the anode;
a first low impedance voltage source coupled to the cathode;
a second low impedance voltage source of lower value than the first low impedance voltage source coupled to the anode via a first switch;
first current source coupled to the anode via a second switch; and
a second current source coupled to the anode via a third switch,
wherein the amplifier is coupled to said anode and said cathode to output the difference in potentials across the programmable variable resistance cell.

10. The voltage reference of claim 9, further comprising an amplifier coupled to the anode to perform voltage buffering.

11. The voltage reference as recited in claim 9, wherein said first and second current sources are implemented with transistors.

* * * * *